(12) United States Patent
De Vries et al.

(10) Patent No.: US 10,006,124 B2
(45) Date of Patent: Jun. 26, 2018

(54) SLOT-DIE COATING METHOD AND APPARATUS

(71) Applicant: Nederlandse Organisatie voor toegepast-natuurwetenschappelijk onderzoek TNO, 's-Gravenhage (NL)

(72) Inventors: Ike Gerke De Vries, 's-Gravenhage (NL); Maarten van Lent, 's-Gravenhage (NL); Jeroen Anthonius Smeltink, 's-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 65 days.

(21) Appl. No.: 14/908,618

(22) PCT Filed: Jul. 28, 2014

(86) PCT No.: PCT/NL2014/050521
§ 371 (c)(1),
(2) Date: Jan. 29, 2016

(87) PCT Pub. No.: WO2015/016706
PCT Pub. Date: Feb. 5, 2015

(65) Prior Publication Data
US 2016/0168709 A1 Jun. 16, 2016

(30) Foreign Application Priority Data

Jul. 30, 2013 (EP) .................................... 13178541

(51) Int. Cl.
*B05C 3/02* (2006.01)
*C23C 16/52* (2006.01)
(Continued)

(52) U.S. Cl.
CPC ............... *C23C 16/52* (2013.01); *B05C 3/02* (2013.01); *B05C 5/0254* (2013.01);
(Continued)

(58) Field of Classification Search
USPC ....... 118/300, 410, 321, 419, 668, 712, 420, 118/421, 679–682; 239/597, 601;
(Continued)

(56) References Cited

U.S. PATENT DOCUMENTS 3,698,621 A * 10/1972 Burke .................. B23K 20/002
228/4.1
4,208,685 A * 6/1980 Matla ...................... F16F 15/03
360/266.2
(Continued)

FOREIGN PATENT DOCUMENTS

CN 1438942 A 8/2003
CN 1714426 A 12/2005
(Continued)

OTHER PUBLICATIONS

Oct. 23, 2014—International Search Report and Written Opinion of PCT/NL2014/050521.

*Primary Examiner* — Yewebdar T Tadesse
(74) *Attorney, Agent, or Firm* — Banner & Witcoff, Ltd.

(57) ABSTRACT

A slot-die coating apparatus for manufacturing a patterned coating layer (3) on a substrate (1) comprises a substrate carrier (6), a coating device, a sensor facility (70) and a controller (80). The substrate carrier (6) is arranged on a support for providing the substrate (1). The coating device comprises a head-side unit and a support-side unit (50, 55; 52 resp.) that are mutually movable with respect to each other by a motor (52, 56). The head-side unit comprises a translator part (52) and a slot-die coating head (2). The support-side unit (55) comprises a stator part (56) of the
(Continued)

motor. The controller (80) controls the motor (52) to position the slot-die coating head at a desired distance (Ds). The support-side unit (55) has a mass that is at least equal to the mass of the head-side unit (50), and the support-side unit (55) is flexibly coupled to the support (60).

13 Claims, 6 Drawing Sheets

(51) Int. Cl.
*B05C 5/02* (2006.01)
*B05C 11/10* (2006.01)
*B05B 13/04* (2006.01)

(52) U.S. Cl.
CPC ........ *B05C 5/0258* (2013.01); *B05C 11/1018* (2013.01); *B05B 13/0473* (2013.01)

(58) Field of Classification Search
USPC .................................................. 425/375
See application file for complete search history.

(56) References Cited

U.S. PATENT DOCUMENTS

| | | |
|---|---|---|
| 4,520,049 A | 5/1985 | Nakanishi |
| 5,536,313 A | 7/1996 | Watanabe et al. |
| 5,663,453 A | 9/1997 | Karrer |
| 6,010,570 A | 1/2000 | Motoda et al. |
| 7,041,336 B2 | 5/2006 | Masuda et al. |
| 8,096,483 B2 | 1/2012 | Riney |
| 2003/0054107 A1 | 3/2003 | Trabold et al. |
| 2004/0028830 A1 | 2/2004 | Bauer |
| 2004/0083953 A1 | 5/2004 | Collins et al. |
| 2007/0231479 A1 | 10/2007 | Ogawa et al. |
| 2008/0213471 A1 | 9/2008 | Oki et al. |
| 2011/0115849 A1 | 5/2011 | Seki et al. |
| 2013/0284833 A1 | 10/2013 | Fritz et al. |
| 2017/0136481 A1 | 5/2017 | Fritz et al. |

FOREIGN PATENT DOCUMENTS

| | | |
|---|---|---|
| CN | 1974027 A | 6/2007 |
| CN | 102971080 A | 3/2013 |
| EP | 2402091 A1 | 1/2012 |
| GB | 1131165 A | 10/1968 |
| GB | 1262057 A | 2/1972 |
| JP | S62-140670 A | 6/1987 |
| JP | H 0640987 A | 2/1994 |
| JP | H07204570 A | 8/1995 |
| JP | 2000325858 A | 11/2000 |
| JP | 2000-334351 A | 12/2000 |

\* cited by examiner

SLOT-DIE COATING METHOD AND APPARATUS

CROSS-REFERENCE TO RELATED APPLICATIONS

This application is a U.S. National Stage application under 35 U.S.C. § 371 of International Application PCT/NL2014/050521 (published as WO 2015/016706 A1), filed Jul. 28, 2014, which claims priority to Application EP 13178541.2, filed Jul. 30, 2013. Benefit of the filing date of each of these prior applications is hereby claimed. Each of these prior applications is hereby incorporated by reference in its entirety.

FIELD AND BACKGROUND

The present disclosure relates to a slot-die coating method and apparatus for manufacturing a patterned coating layer on a substrate. Organic coatings layers are typically applied to a substrate as a liquid solution, e.g. for manufacturing OLED or OPV devices. For many applications, e.g. manufacturing of photo-active layers and/or light-emitting layers, it may be desired to provide one or more homogeneous coating layers on a substrate, i.e. having a homogeneous layer thickness. One technique for manufacturing a homogeneous coating layer may be referred to as "slot-die coating". This technique typically comprises providing a slot-die coating head arranged over a substrate surface. The slot-die coating head comprises an outflow opening forming a slit that is arranged in a slit direction over the substrate surface. A coating fluid, e.g. supplied by a coating fluid supply, flows through the outflow opening onto the substrate surface. A relative movement between the outflow opening and the substrate surface is controlled along a coating direction. The coating direction is typically transverse, i.e. having a perpendicular component, to the slit direction. In this way a homogeneous layer may be manufactured along a width of the slit onto the substrate surface.

In addition to having a homogeneous coating layer, it may be desired to provide a patterning of the coating on the substrate surface, e.g. wherein the patterned coating comprises coated areas on the substrate surface separated by uncoated areas. For example, for the manufacture of photo-active layers and/or light-emitting layers it may be desired to provide separated active areas on a substrate, e.g. for building an array of photo-cells. Many different methods are known for providing a patterned coating layer, e.g. printing or imprinting techniques such as inkjet printing, rotatory screen printing, gravure printing, offset printing, flexo printing. Unfortunately, in practice these processes do not always provide a desired homogeneity of the coating layer and/or suitability for large scale production, e.g. in a roll-to-roll process. It may thus be advantageous to use a patterning technique that can be combined with a slot-die coating process.

A first option for manufacturing a patterned coating with slot-die coating may be referred to as "in-situ patterning" or "active patterning", wherein the slot-die coating head is actively used for selectively applying the coating on specific areas of the substrate. In one example, an intermittent transfer is controlled of the coating fluid from the slot-die coating head onto the substrate surface, e.g. by switching a valve between the slot-die coating head and the coating fluid supply and/or selectively removing the slot-die coating head from the substrate. In this way coated areas may be provided having boundaries transverse to the coating direction. Unfortunately, it is found that an intermittent switching of the supply and/or removal and reapplication of the coating head may result in edge effects wherein the coating is no longer uniform e.g. due to the accumulation of coating material on the coating head. For example, U.S. Pat. No. 7,041,336 and U.S. Pat. No. 5,536,313 describe problems with edge effects and propose adaptations to the nozzle to better control the flow-rate out of the nozzle when the flow is interrupted. Disadvantageously, this may lead to a complicated nozzle design.

An alternative method for consideration that could to have as well a uniform leading as a trailing coating edge is to dynamic control a distance between the coating head and the substrate. Therein, the coating head is moved towards a first position, close to the substrate to initiate the coating process at the leading edge of a pattern to be formed. To interrupt the coating process at the trailing edge of the pattern the coating head is moved towards a second position, further away from the substrate. Depending on the properties of the liquid with which the substrate is to be coated the first position is typically selected in a range of 5-250 micron. In the process of coating between the leading edge and the trailing edge the coating head should be held close (e.g. with a tolerance of about 1 micron) to the first position. In addition the positioning of the coating head should be carried out at a relatively high speed. For example, the coating head should be displaced over a distance of 4 mm within 25 ms. In practice it has been found that the combination of these requirements is difficult to realize. Fast movements of the coating head tend to cause vibrations in the coating apparatus that result in relatively large temporal variations in the distance between the coating head and the substrate. This results in non-uniformities in the applied coating.

SUMMARY

It is an object of the present invention to provide an improved slot-die coating apparatus.

It is a further object of the present invention to provide an improved slot-die coating method.

In accordance with a first aspect of the invention a slot-die coating apparatus is provided as claimed in claim 1.

In accordance with a second aspect of the invention a slot-die coating method is provided as claimed in claim 13.

In the slot-die coating method and apparatus according to the present invention the at least a support-side unit has a mass that is at least equal to the mass of the at least a head-side unit, and the at least a support-side unit is flexibly coupled to the support.

In case the apparatus has more than one support-side unit and/or more than one head-side unit, the total mass of the support-side units is at least equal to the total mass of the support-side units.

In this way it is rendered to possible to rapidly displace the coating head between its active position close to the substrate and its inactive position remote from the substrate, while substantially mitigating vibrations in the environment including the a substrate carrier. Therewith the distance between the coating head and the substrate carrier can also be accurately and rapidly controlled.

BRIEF DESCRIPTION OF THE DRAWINGS

These and other aspects are described in more detail with reference to the drawing. Therein.

DETAILED DESCRIPTION OF EMBODIMENTS

Figure 1:
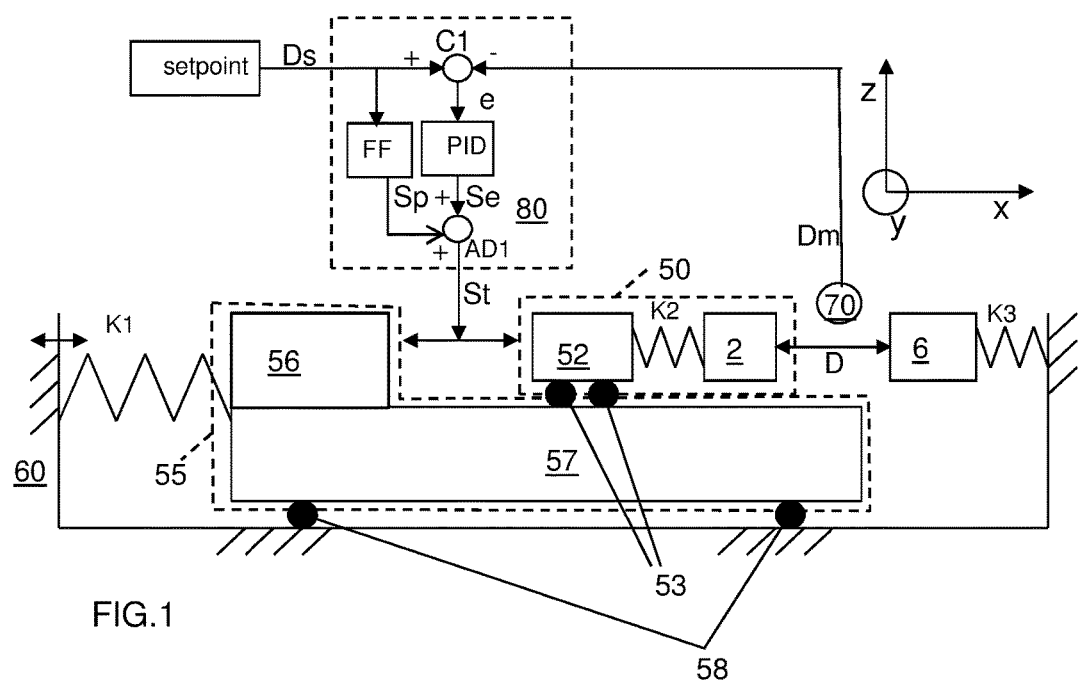
FIG. 1 shows a first embodiment of slot-die coating apparatus according to the first aspect of the present invention.

Like reference symbols in the various drawings indicate like elements unless otherwise indicated.

Unless otherwise defined, all terms (including technical and scientific terms) used herein have the same meaning as commonly understood by one of ordinary skill in the art to which this invention belongs as read in the context of the description and drawings. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some instances, detailed descriptions of well-known devices and methods may be omitted so as not to obscure the description of the present systems and methods. Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be further understood that the terms "comprises" and/or "comprising" specify the presence of stated features but do not preclude the presence or addition of one or more other features. All publications, patent applications, patents, and other references mentioned herein are incorporated by reference in their entirety. In case of conflict, the present specification, including definitions, will control.

As used herein, the term "substrate" has its usual meaning in materials science as an object comprising a surface on which processing is conducted, in this case layer deposition. In a typical semi-conductor manufacturing process, the substrate may be a silicon wafer. In the production of flexible electronics, the substrate typically comprises a foil. The term "foil" refers to a sheet comprising one or more layers of material. Preferably, the foil is flexible such that it can be used in a roll-to-roll (R2R) or roll to sheet (R2S) manufacturing process. For such purpose, a foil may be considered flexible if it can be rolled or bent over a radius of curvature of 50 cm or less, e.g. 12 cm, without losing its essential functionality, e.g. an electronic functionality. Alternatively, or in conjunction a foil may be considered flexible if it has a flexural rigidity smaller than 500 Pa·m$^3$.

As used herein, a substrate carrier comprises a structure capable of carrying and/or transporting a substrate. For example, in a R2R process, a substrate carrier may comprise one or more rolls arranged for supplying and moving the substrate thereby passing the substrate surface past one or more deposition heads, i.e. in the present case a slot-die coating head. The substrate carrier and/or slot-die coating head are typically comprised in a slot-die coating apparatus, which may comprise further parts, e.g. a coating fluid supply or storage arranged for supplying the coating fluid to the slot-die coating head to provide a continuous or semi-continuous stream of coating fluid from an outflow opening of the coating head.

As used herein, the term "coating" is used to indicate the process of applying a layer of material. The term "coating layer" indicates the layer of material covering a part of a substrate or intermediate layer. Typical for the coating layers as described herein is that they may be initially applied as a fluid or liquid to allow a degree of self-assembly or relocation of the coating after deposition, e.g. driven by differences in surface energy. After the coating layer achieves a desired patterning, the coating layer may be hardened, e.g. by curing and/or drying.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The description of the exemplary embodiments is intended to be read in connection with the accompanying drawings, which are to be considered part of the entire written description. In the drawings, the size and relative sizes of systems, components, layers, and regions may be exaggerated for clarity. Embodiments are described with reference to cross-section illustrations that are schematic illustrations of possibly idealized embodiments and intermediate structures of the invention.

In the description, relative terms as well as derivatives thereof should be construed to refer to the orientation as then described or as shown in the drawing under discussion. These relative terms are for convenience of description and do not require that the system be constructed or operated in a particular orientation unless stated otherwise. It will further be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. It will further be understood that when a particular step of a method is referred to as subsequent to another step, it can directly follow said other step or one or more intermediate steps may be carried out before carrying out the particular step.

Figure 4:
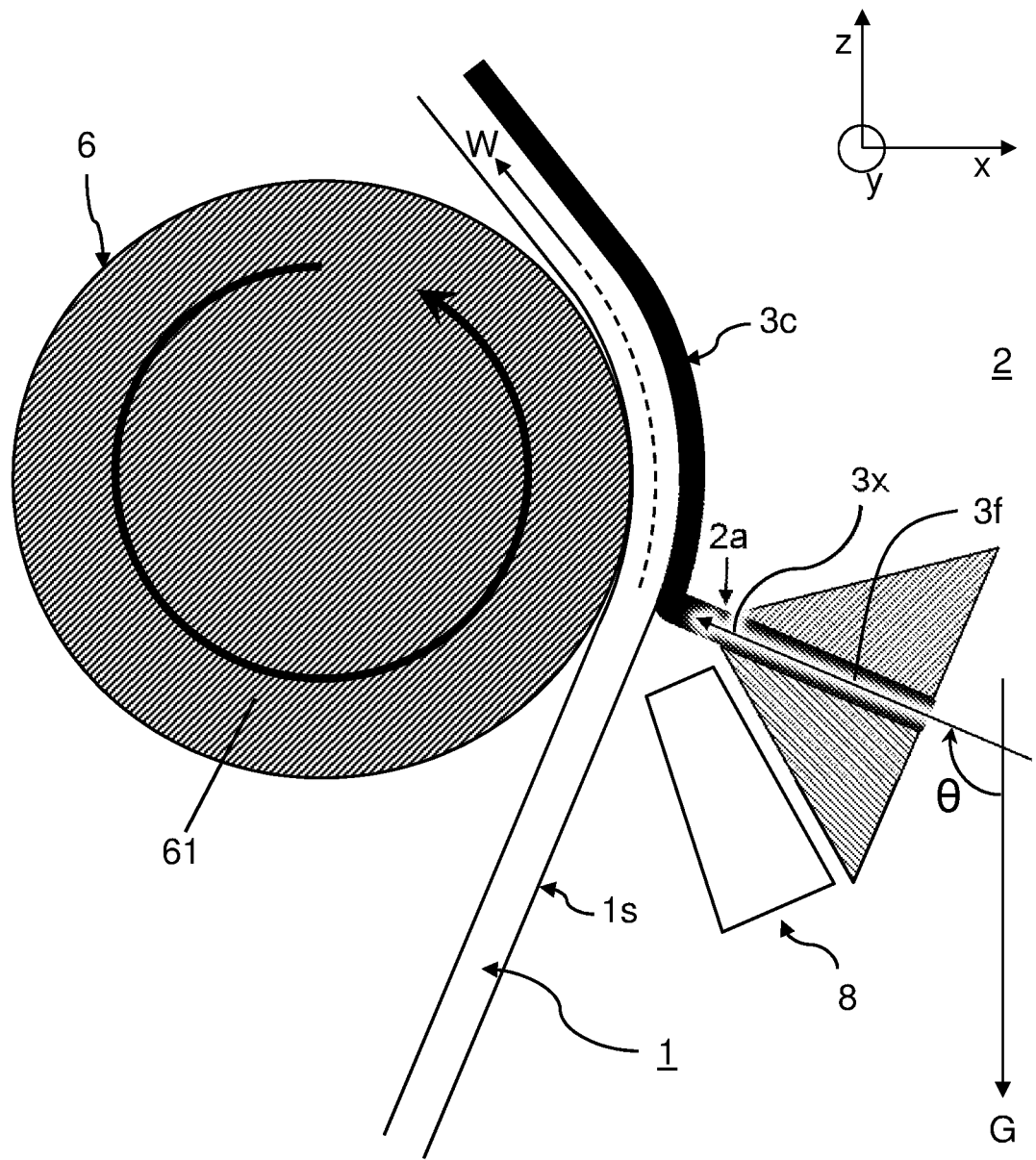
FIG. 4 shows in more detail parts for use in various embodiments of slot-die coating apparatus according to the first aspect of the present invention.

FIG. 1. schematically shows a slot-die coating apparatus for manufacturing a patterned coating layer on a substrate. The apparatus comprises a substrate carrier 6 arranged on a support 60. The substrate carrier 6, shown in more detail in FIG. 4, is arranged for providing the substrate 1 comprising a substrate surface 1s.

The apparatus comprises a coating device with at least a head-side unit and a support-side unit 50, 55 that are mutually movable with respect to each other by at least one motor 52, 56.

The head-side unit 50 comprises a translator part 52 of the at least one motor and a slot-die coating head 2. The slot-die coating head 2, as shown in more detail in FIG. 4 comprises an outflow opening 2a from which outflow opening 2a, in use, flows a coating fluid 3f. The outflow opening 2a forms a slit that is, in use, arranged in a slit direction y over the substrate surface 1s.

The at least a support-side unit 55 comprising a stator part 56 of the at least one motor.

The apparatus comprises a sensor facility 70 for measuring a distance D between the outflow opening 2a and the substrate surface in a translation direction x transverse to the slit direction y. The sensor facility 70 provides a sense signal indicative for a measured value of the distance D. Alternatively the sensor facility may measure a distance to the surface of the substrate carrier 6. In that case the distance to the substrate surface may be determined by subtraction of the thickness of the substrate from the measured distance.

A controller 80 is provided that is arranged for controlling the at least one motor 52, 56 in accordance with an input signal Ds indicative for a desired value of said distance D and said sense signal Ds, in order to position the slot-die coating head 2 at a distance having said desired value.

Relative movement between the first part 50 and the second part 55 is facilitated by a bearing 53, e.g. an air-bearing or an elastic bearing. Relative movement between the second part 55 and the support 60 is facilitated by a further bearing 58, e.g. an air-bearing or an elastic bearing.

The at least a support-side unit 55 has a mass that is at least equal to the mass of the at least a head-side unit 50 and the at least a support-side unit 55 is flexibly coupled to the support 60. The spring constant K1 of the coupling is for example selected in a range from 100 to 100.000 N/m, preferably in arrange from 1000 to 50.000 N/m. For comparison, the spring constant K2 of the mechanical coupling between the translator part 52 of the motor and the coating head 2, typically has a substantially higher value, e.g. in the order of 10E8-10E10 N/m. Also the spring constant K3 for the mechanical coupling between the substrate carrier 6 and the support 60 has a substantially higher value, e.g. in the order of 10E6-10E8 N/m.

By way of example the support-side unit 55 including the stator 56 and the additional mass 57 has a mass of about 250 kg. The translator 52 of the motor each and the coating head 2 each have a mass of 25 kg. Accordingly, the mass of the support-side unit 55 is 5 times higher than the mass of the head-side unit 50. The mass of the substrate carrier 6 is 100 kg. The weight of the floor, which serves as the support 60 is estimated to have a weight of 10,000 kg.

Typically a higher stiffness is used for the coupling K1 if the mass of the support-side unit 55 is higher. A ratio for the stiffness K1 divided by the mass of the support-side unit is for example in the range 10-100 $s^{-2}$, in this case 40 $s^{-2}$.

In an embodiment as shown in FIG. 1, an additional mass 57 is tightly coupled to the stator part 56 of the motor. However, alternatively the stator part 56 may be designed to have a relatively large mass itself, therewith obviating a separate mass.

The controller 80 has a feedback control section PID for generating a first control signal Se on the basis of the difference e between the specified value Ds and the measured value Dm of the distance. The difference is calculated by a comparator C1. The controller 80 also has a feed forward control section FF for generating a prediction control signal Sp on the basis of the specified value Ds. The sum signal St obtained by add unit AD1 from the signals Se, Sp of the feedback control section PID and the feed forward control section FF is used to control the motor. The controller may further have an adaptation section for improving the accuracy and response time based on the observed behavior of the system.

Figure 2:
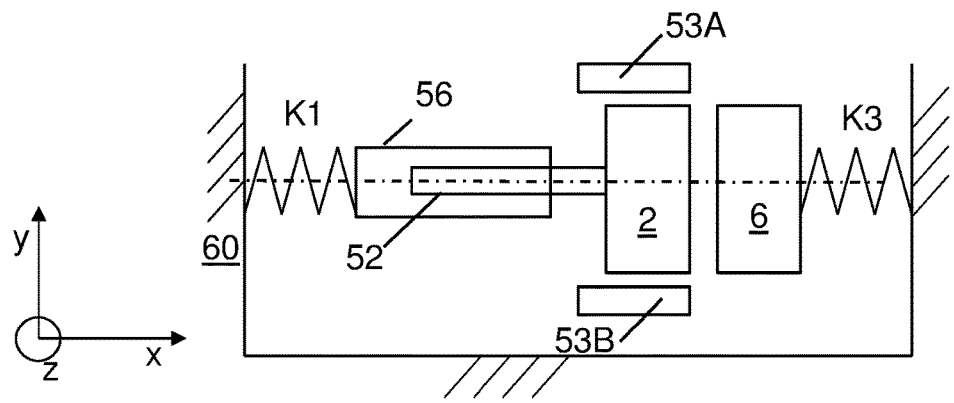
FIG. 2 shows a second embodiment of slot-die coating apparatus according to the first aspect of the present invention, FIG. 3A-3D respectively show in a top-view, a front view, an exploded view and a perspective view a third embodiment of slot-die coating apparatus according to the first aspect of the present invention.

FIG. 2 schematically shows an embodiment, wherein a linear motor 52, 56 is arranged in the translation direction x at a side of the coating head 2 opposite the substrate carrier 6. The coating head 2 is symmetrically suspended by bearings 53A, 53B, formed by leaf springs.

FIG. 3A-D respective show in a top-view, a front view, an exploded view and a perspective view a further embodiment of a coating apparatus according to the present invention. In these figures reference numerals corresponding to those used in FIG. 1 indicate corresponding parts. Parts of the support-side unit 55A in this figure corresponding to those of the support-side unit 55 in FIG. 1 have a suffix "A" added to the reference number. For example, the stator part 56 of the motor, forming part of the support-side unit is indicated here as 56A. Also other duplicated parts are indicated with a suffix A or B.

In the embodiment shown the head-side unit 50 includes an elongate central stage 54 to which the coating head 2 is mounted at a first end. The head-side unit 50 further includes in addition to the translator part 52A of a first motor a translator part 52B of a second motor. The translator parts 52A, 52 are arranged at a respective side of the central stage 54.

Figure 3A:
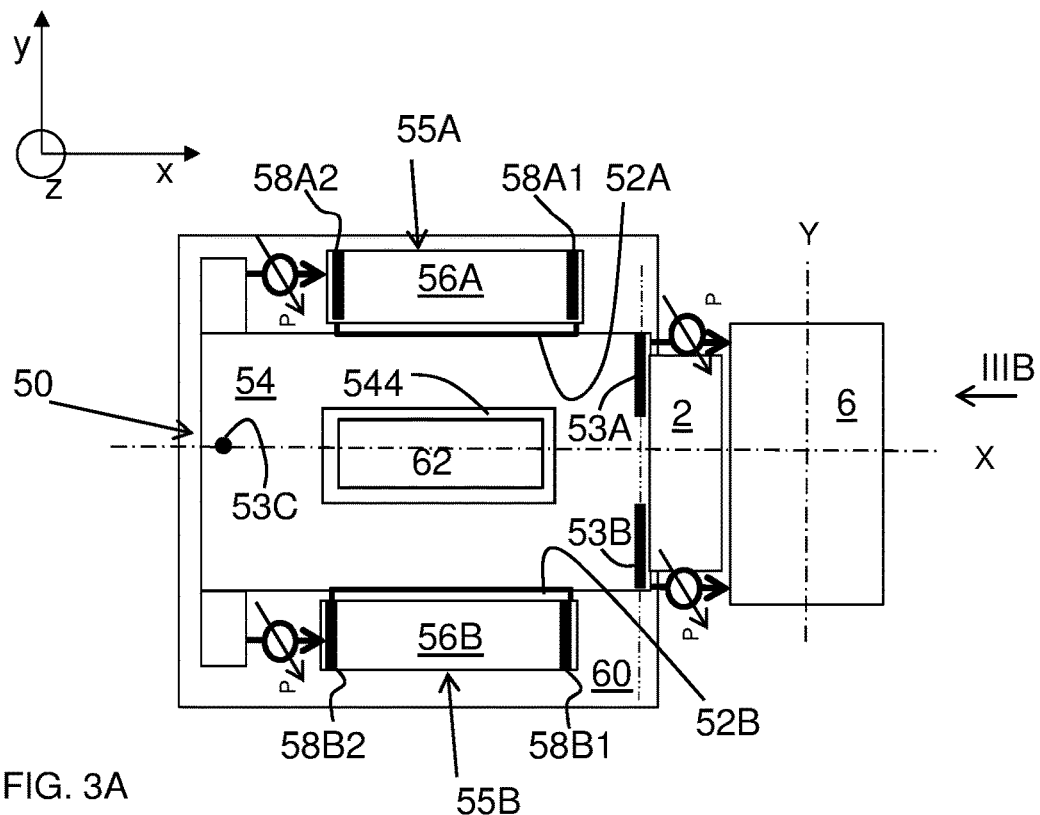
Figure 3B:
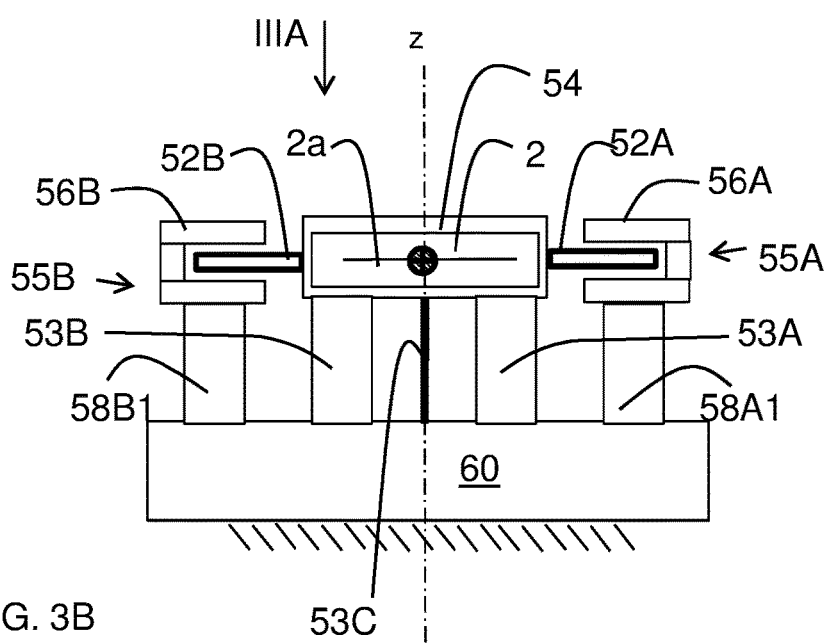
Figure 3C:
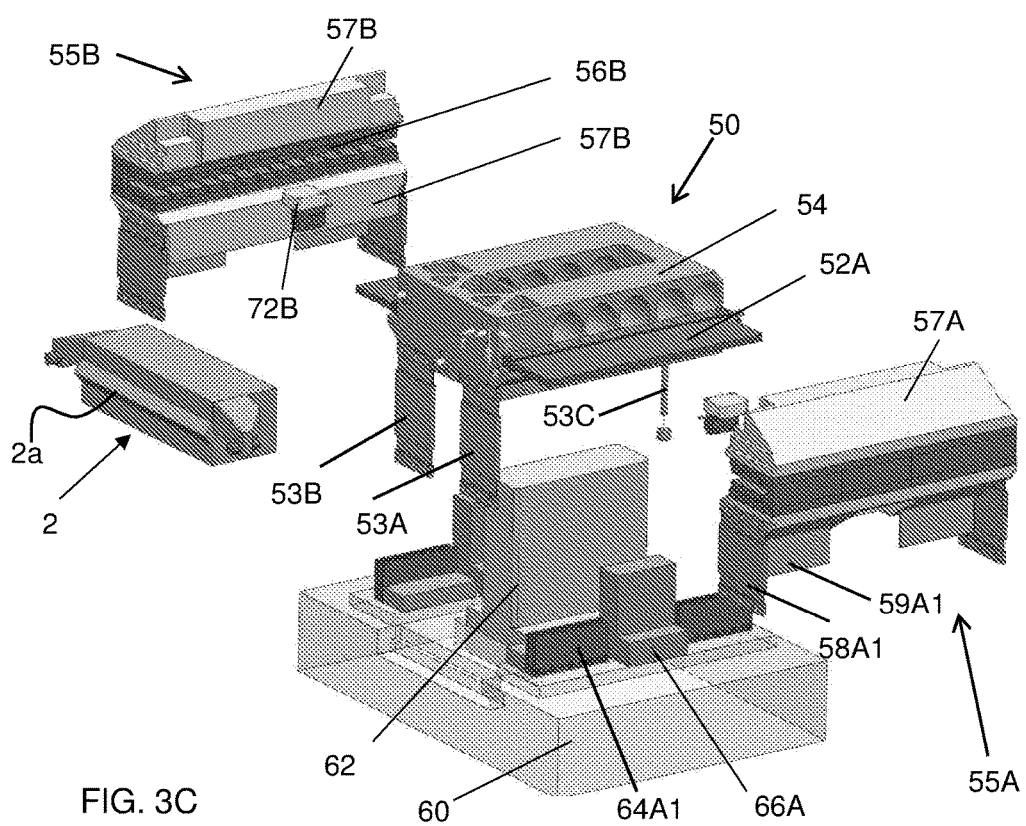
Figure 3D:
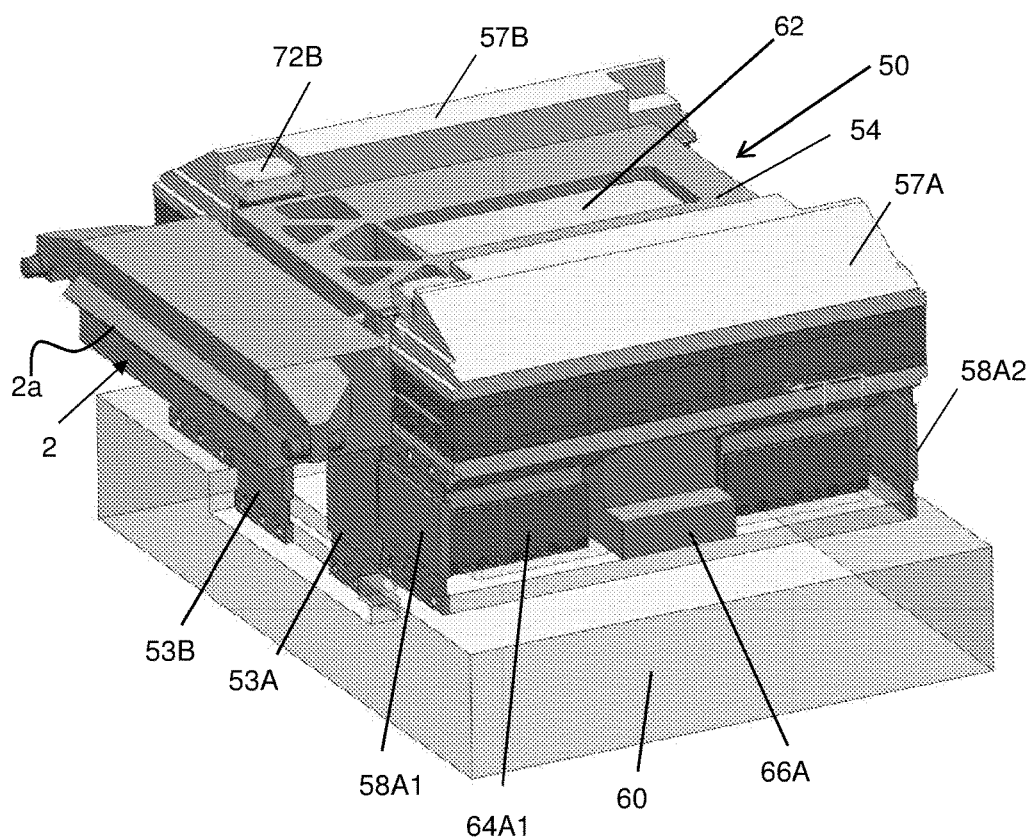

A further support-side unit 55B shown therein comprises a stator part 56B of a second motor as well as an additional mass 57A, 57B (As can best be seen in FIG. 3C). The further support-side unit 55B and the support-side unit 55A together have a mass that is at least equal to the mass of the head-side unit 50.

In the embodiment shown the flexible coupling of the support-side unit 55A includes a first and second leaf spring 58A1, 58A2 arranged in a plane transverse to the translation direction x. The support-side unit 55A is coupled therewith at a first and a second end to the support 60. Likewise, the flexible coupling of the further support-side unit 55B includes a first and second leaf spring 58B1, 58B2 arranged in a plane transverse to the translation direction x. Therewith the further support-side unit 55B is coupled at its first and second end to the support 60. The leaf springs 58A1, 58A2, 58B1, 58B2 enable the support-side units 55A, 55B to translate in the direction x but prevent rotations and translations in other directions. The leaf springs may also determine the spring constant K1 in the mechanical coupling between the support 60 and the support-side units 55A, 55B. Alternatively however, the mechanical coupling between the support 60 and the support-side units 55A, 55B may be determined for a smaller or larger part by a respective additional motor. This makes it possible to control the coupling dynamically.

As can be seen in FIG. 3C, the support-side unit 55A is provided with damper plates, see e.g. 59A1, that are slidingly arranged in a rail, see e.g. 64A1 mounted on the support 60. If a translation of the support-side unit 55A tends to exceed a predetermined value its motion is stopped by stroke limiter 66A mounted on the support. The further support-side unit 55B has an identical construction of slidingly arranged damper plates cooperating with a stroke limiter.

The elongate central stage 54 is coupled at its first end via one or more leaf springs 53A, 53B to the support 60. The leaf springs 53A, 53B are arranged in a plane transverse to the translation direction x.

This coupling of the central stage 54 to the support 60 allows the central stage to freely translate within a required range along the translation direction x, whereas translations in other directions y, z are prevented. This coupling also allows for a rotation Rz of the central stage 54 in a plane extending through the translation direction x and the slit direction y. In this way it is possible to tune an orientation of the coating head by controlling the drive signals of the first and the second motor 52A, 56A; 52B, 56B.

At its second end the elongate central stage 54 is further coupled to the support by a bar 53C extending in a direction transverse to said slit direction y and said translation direction x. The bar 53C therewith supports the central stage 54 at its second end while not blocking rotations Rz of the central stage 54.

The slot-die coating apparatus as shown herein, further comprises a blocking member 62 that is stiffly coupled to the support 60. The blocking member 62 protrudes in a direction z transverse to the translation direction x with play through an opening 544 in the central stage 54. This provides for a robust fail-safe measure. Even if in case of a malfunctioning of the control device 80, or if a wrong input signal is supplied to the control device 80 damage by excessive movements is prevented.

FIG. 4 shows part of an apparatus according to the present invention in more detail. More in particular a slot-die coating head 2 is shown arranged in front of a drum 61, forming part of the substrate carrier. During operation the substrate carrier 6, by means of the drum 61 transports the substrate 1 in a web direction W. As can be seen therein, the slot-die coating head 2 comprises an outflow opening 2a. The outflow opening 2a forms a slit that is, in use, arranged in a slit direction y over the substrate surface 1s. In use a coating fluid flows from the outflow opening 2a, which forms a layer 3c on the substrate surface 1s.

In one embodiment, the slot-die coating head 2 is tilted at an angle to provide an outflow from the outflow opening 2a in an outflow direction 3x having an angle θ between 60 and 120 degrees plane angle with respect to a gravitational direction G. In other words, the coating fluid can flow close to a horizontal direction. The substrate 1 is moved substantially perpendicular to the outflow direction 3x, in front of the outflow opening 2a. Having a coating fluid flow close to a horizontal direction and neither the coating head nor the substrate beneath the outflow opening as seen in a gravitational direction, can have an advantage that if any uncontrolled excess coating ink/fluid falls from the coating head or the outflow opening, such excess coating ink/fluid will fall downwards, i.e. not on the substrate or the coating head. It will be appreciated that such an arrangement can be particularly advantageous in the present methods and systems wherein a coating supply is regularly interrupted.

The direction in which the coating head 2 is translated to start and stop the coating process does not necessarily coincide with the direction 3x, as long as the directions have a common component. For example the translation direction may be arranged in the direction x in the horizontal plane, whereas the outflow direction may be arranged in an angle in the range between −45 to +45 degrees plane angle with the translation direction. A translation direction in the horizontal plane has the advantage that gravitation does not or not substantially effect the position of the coating head in the translation direction. The normal vector of the surface of the substrate may point along said translation direction x, but it is sufficient if the normal of the surface at least has a component in that direction, so that movements of the head in the direction x result in a change of the distance between the head and the surface.

Optionally a suction device 8 can be provided to suck up the excess coating ink/fluid. Alternatively or in addition, a suction device or vacuum chamber 8 having an opening near the outflow opening 2a can have a function to pull a meniscus of the outflow backwards compared to the web direction W of the moving substrate 1. This may compensate a fast moving substrate pulling the meniscus of the outflow in the web direction W. Providing a suction on an opposite side of the outflow opening 2a with respect to a movement of a substrate can thus allow faster relative movements, e.g. preventing air bubbles from getting trapped under the coating layer.

In another or further embodiment, the slot-die coating head 2 is tilted at an angle to provide an outflow from the outflow opening 2a in an outflow direction 3x having an angle θ of more than 90 degrees plane angle with respect to a gravitational direction G. In other words, the outflow direction 3x is tilted upwards. Having an upward outflow direction 3x can have an advantage that air bubbles trapped in the fluid supply and being lighter than the coating fluid, can escape from the outflow opening by moving upwards. It will be appreciated that this can be particularly useful when the fluid supply is intermittently interrupted according to the present methods and systems.

Figure 5:
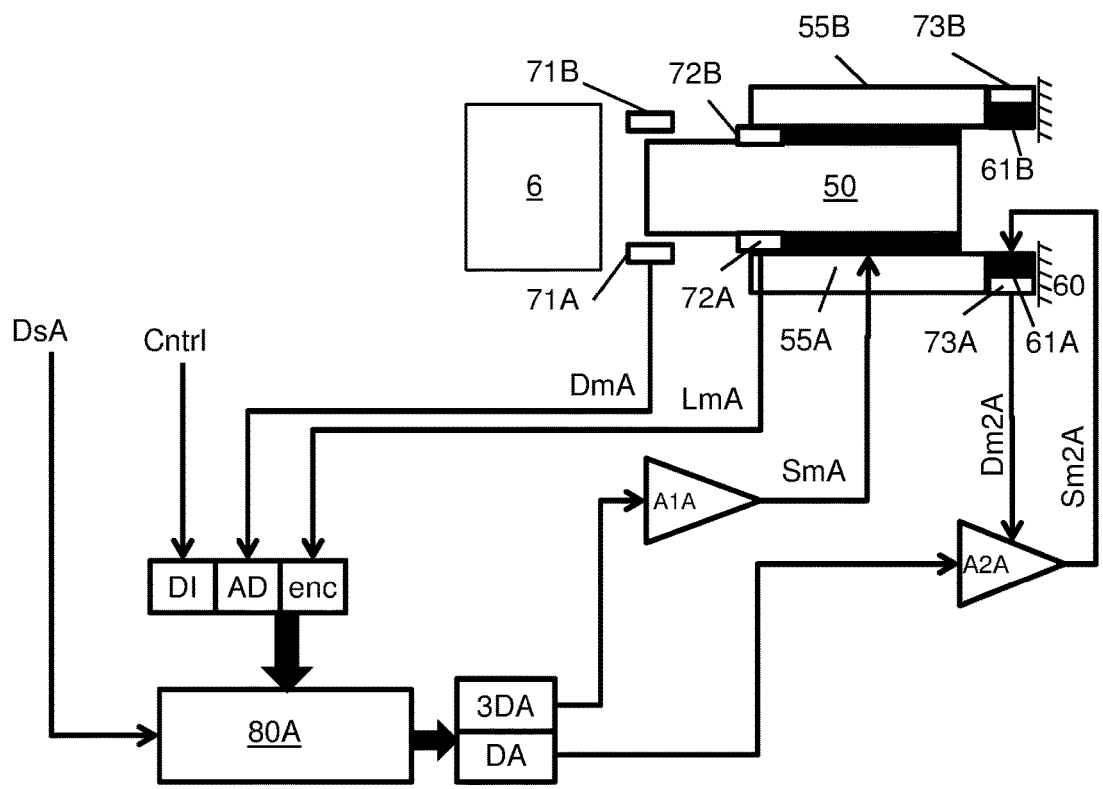
FIG. 5 shows in more detail a control system for use in the third embodiment of the slot-die coating apparatus according to the first aspect of the present invention.

FIG. 5 schematically shows in more detail part of a control system in an embodiment of the slot die coating apparatus of the present invention, for example for the embodiment as shown in FIG. 3A-3D. For clarity only the part of the control system for one side of the apparatus is shown. Parts or signals therein corresponding to FIG. 1 have a suffix A. The other side of the apparatus is typically controlled analogously and therefore is not shown here.

The control system comprises a control input for receiving a desired control pattern. The control pattern may include a specification of the desired position DsA of the coating head as a function of time. The control system further has an input for receiving a external trigger signal Cntrl that causes the control system to start controlling the apparatus according to the desired pattern. Typically both parts of the control system receive the same control pattern and the same trigger signal.

The control system 80A comprises a first distance sensor 71A, such as a capacitive distance sensor, for sensing a distance between the coating head 2 and the substrate 1 and for providing a indication signal DmA indicative for this distance. The sensor 71A is coupled via an A/D converter to the control system 80A. Alternatively a distance sensor may be used that generates a digital output signal indicative for the sensed distance. In that case an A/D converter is superfluous. The control system also is coupled to a linear encoder 72A that senses a displacement between the stator and the translator of the motor. Via a three phase D/A converter 3DA, the control system controls a three-phase driving unit A1A that enforces the motor with drive signal SmA.

In the embodiment shown, the slot die coating apparatus further includes a active damping system for damping the movements of the support-side unit 55A. The active damping system includes a further linear motor 61A that is enforced by drive signal Sm2A of a driver A2A that has a negative feedback input coupled to a Hall sensor 73A which measures the position of the support-side unit 55A with respect to the support 60 and in response provides sense signal Dm2A. In the embodiment shown, the damping system A2A, 61A, 73A is activated in time intervals wherein the coating head 2 is maintained at a stable position with respect to the substrate 1 to be coated.

Depending on the pattern to be coated on the substrate, the movements of the coating head could cause an excitation of parts of the apparatus occur due to resonances. This could be avoided by properly selecting the patterns to be coated, or the speed at which the coating takes place, or the motion profile, but this possibly puts restrictions on the coating process.

A damping system counteracts such excitations. Although damping may be provided passively, an active damping system has the advantage that it can be tuned to the circumstances, e.g. a damping strategy may be applied that optimizes speed and accuracy for a particular pattern.

In an embodiment for example, the damping facility is deactivated while displacing the head-side unit.

For some applications it may be sufficient to merely displace the coating head in order to obtain a desired coating pattern, for example if the pattern to be provided only has interruptions over short distances in the transportation direction of the substrate. In that case the flow of coating fluid does not need to be interrupted. It is sufficient if the coating head is moved away from the substrate surface to form the interruption in the coating layer.

In an embodiment the slot the coating apparatus comprises a further controller for controlling a coating fluid supply. Therewith the flow of coating fluid can be interrupted to obtain longer uncoated portions. The further controller is preferably synchronized with the controller 80A for controlling the motor. Depending on the coating fluid used, the surface energy of the substrate surface and other conditions, e.g. a transportation speed of the substrate, the control signal for the coating fluid supply may lag or lead the control signal for the motor or may coincide therewith. For example, the coating fluid supply may be activated at a selected point in time in a time interval extending a first time before to a second predetermined time after a point in time that the coating head arrives at its desired position close to the substrate. Analogously, the coating fluid supply may be deactivated at a selected point in time in a time interval extending a first time before to a second predetermined time after a point in time that the coating head arrives at its desired position remote from the substrate.

Figure 6:
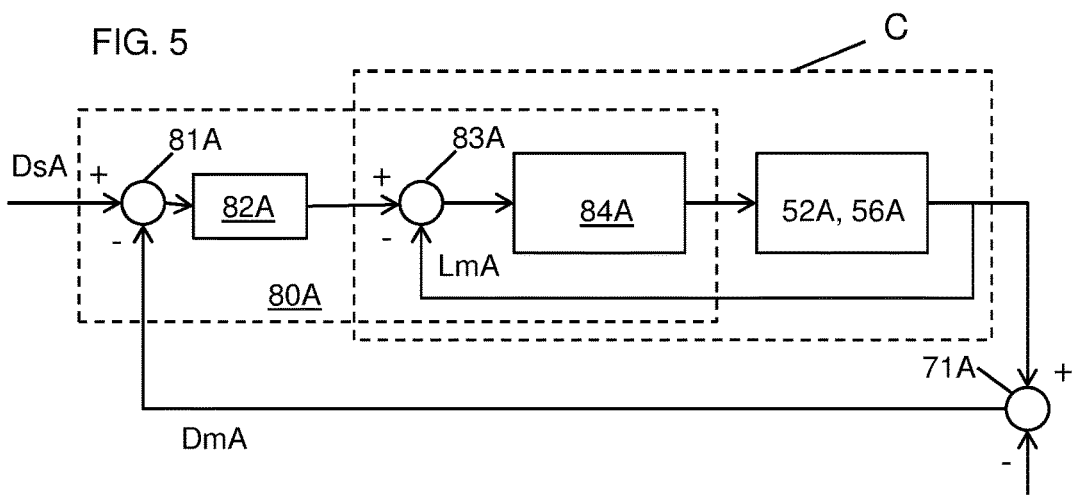
FIG. 6 shows part of the control system of FIG. 5 in more detail.

FIG. 6 shows part of the control system of FIG. 5 in more detail. As shown in FIG. 6, the controller 80A in that embodiment includes a first control module 82A and a second control module 84A. The first control module 82A generates a first control signal in response to an error signal provided by comparator 81A. The second control module 84A generates a drive signal for controlling the motor in response to an error signal received from a second comparator 83A that compares the linear encoder signal LmA with the first control signal. The second control module 84A compensates for non-linear response characteristics of the motor 52A, 56A. The first control module 82A is optimized to provide for a rapid and accurate control of the position of the coating head, using the linearized characteristics of the combination C of the motor 52A, 56A and the control parts 83A, 84A.

While example embodiments were shown for providing a coating layer on a substrate, also alternative ways may be envisaged by those skilled in the art having the benefit of the present disclosure for achieving a similar function and result. The various elements of the embodiments as discussed and shown offer certain advantages, such as providing homogeneous coating layers. Of course, it is to be appreciated that any one of the above embodiments or processes may be combined with one or more other embodiments or processes to provide even further improvements in finding and matching designs and advantages, e.g. combinations of slot the coating, intermittent coating, shim coating, notched die coating and/or pre-patterning a substrate. It is appreciated that this disclosure offers particular advantages to the manufacture of solar cell arrays, and in general can be applied for any application of large-scale production of homogeneous patterned layers on a substrate or web.

Finally, the above-discussion is intended to be merely illustrative of the present system and should not be construed as limiting the appended claims to any particular embodiment or group of embodiments. Thus, while the present system has been described in particular detail with reference to specific exemplary embodiments thereof, it should also be appreciated that numerous modifications and alternative embodiments may be devised by those having ordinary skill in the art without departing from the scope of the present systems and methods as set forth in the claims that follow. The specification and drawings are accordingly to be regarded in an illustrative manner and are not intended to limit the scope of the appended claims. In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage.

The invention claimed is:

1. Slot-die coating apparatus for manufacturing a patterned coating layer on a substrate, the slot-die coating apparatus comprising
a substrate carrier arranged on a support, arranged for providing the substrate comprising a substrate surface;
a coating device comprising at least a head-side unit and a support-side unit that are mutually movable with respect to each other by at least one motor, the head-side unit comprising a translator part of the at least one motor and a slot-die coating head, the slot-die coating head comprising an outflow opening from which flows a coating fluid, wherein the outflow opening forms a slit that is, in use, arranged in a slit direction over the substrate surface, the support-side unit comprising a stator part of the at least one motor,
a sensor facility for measuring a distance between the outflow opening and the surface of the substrate carrier or the substrate surface in a translation direction transverse to the slit direction and for providing a sense signal indicative for a measured value of said distance;
a controller configured to control the at least one motor in accordance with an input signal indicative for a desired value of said distance, in order to position the slot-die coating head at a distance having said desired value,
wherein the support-side unit has a mass that is at least equal to the mass of the head-side unit, and the support-side unit is flexibly coupled to the support.

2. Slot-die coating apparatus according to claim 1, wherein the translation direction is arranged in a horizontal plane.

3. Slot-die coating apparatus according to claim 1, comprising at least a further support-side unit comprising a stator part of a second motor, the support-side unit and the further support-side unit together having a mass that is at least equal to the mass of the head-side unit, and the further support-side unit being flexibly coupled to the support, the head-side unit further comprising a translator part of the second motor and a central stage to which the coating head is mounted at a first end and to which the translator of the first and the second motor are arranged at a respective side.

4. Slot-die coating apparatus according to claim 3, wherein the flexible coupling of each of the support-side unit and the further support-side unit includes a respective first and second leaf spring arranged in a plane transverse to said translation direction, the support-side unit and the further support-side unit being coupled at a respective end with their respective first and second leaf spring to the support.

5. Slot-die coating apparatus according to claim 4, wherein the support-side unit and the further support-side unit each are provided with a damper plate that is slidingly arranged in a rail mounted on the support.

6. Slot-die coating apparatus according to claim 3, wherein the central stage is coupled at its first end via one or more leaf springs to the support, arranged in a plane transverse to said translation direction.

7. Slot-die coating apparatus according to claim 6, wherein the central stage is coupled at its second end to the support by a bar extending in a direction transverse to said slit direction and said translation direction, enabling said second end to translate in directions transverse to extension directions of the bar.

8. Slot-die coating apparatus according to claim 3, further comprising a blocking member stiffly coupled to the support that protrudes in a direction transverse to the translation direction with play through an opening in the central stage.

9. Slot-die coating apparatus according to claim 1, wherein the controller comprises a damping facility for actively damping a movement of the support-side unit.

10. Slot-die coating apparatus according to claim 9, wherein the damping facility is deactivated while displacing the head-side unit.

11. Slot-die coating apparatus according to claim 9 wherein the damping facility includes a separate control unit for controlling a position of the support-side unit.

12. The slot die coating apparatus according to claim 1, comprising a further controller for controlling a coating fluid supply, the further controller being synchronized with the controller for controlling the at least one motor.

13. Method for manufacturing a patterned coating layer on a substrate, the method comprising flowing a coating fluid through the outflow opening of the slot-die coating apparatus of claim 1 to provide the patterned coating layer on the substrate.

* * * * *